(12) United States Patent
He et al.

(10) Patent No.: US 8,907,673 B2
(45) Date of Patent: Dec. 9, 2014

(54) DYNAMIC FREQUENCY DRIFT CORRECTION METHOD IN MAGNETIC RESONANCE IMAGING

(75) Inventors: Qiang He, Shenzhen (CN); De He Weng, Shenzhen (CN); Xiao Dong Zhou, Shenzhen (CN)

(73) Assignee: Siemens Aktiengesellschaft, Munich (DE)

( * ) Notice: Subject to any disclaimer, the term of this patent is extended or adjusted under 35 U.S.C. 154(b) by 647 days.

(21) Appl. No.: 13/097,270

(22) Filed: Apr. 29, 2011

(65) Prior Publication Data
US 2011/0267057 A1 Nov. 3, 2011

(30) Foreign Application Priority Data
Apr. 30, 2010 (CN) .......................... 2010 1 0160443

(51) Int. Cl.
*G01R 33/48* (2006.01)
*G01R 33/565* (2006.01)

(52) U.S. Cl.
CPC ...... *G01R 33/56563* (2013.01); *G01R 33/4828* (2013.01)
USPC .......................................... 324/314; 324/307

(58) Field of Classification Search
USPC .......................................... 324/307, 309, 314
See application file for complete search history.

(56) References Cited

U.S. PATENT DOCUMENTS

| 5,928,146 A * | 7/1999 | Itagaki et al. ................. 600/410 |
| 6,516,210 B1 * | 2/2003 | Foxall ............................ 600/410 |
| 7,170,289 B2 * | 1/2007 | Kumai et al. ................. 324/309 |
| 2005/0248343 A1 | 11/2005 | Kruger et al. |
| 2007/0090837 A1 * | 4/2007 | Van Der Kouwe et al. ... 324/307 |
| 2011/0221439 A1 * | 9/2011 | Posse ............................ 324/307 |

OTHER PUBLICATIONS

"Highly Selective Water and Fat Imaging Applying Multislice Sequences without Sensitivity to $B_1$ Field Inhomogeneities," Schick et al., Magnetic Resonance in Medicine, vol. 38 (1997) pp. 269-274.

* cited by examiner

*Primary Examiner* — Melissa Koval
*Assistant Examiner* — Rishi Patel
(74) *Attorney, Agent, or Firm* — Schiff Hardin LLP

(57) ABSTRACT

For magnetic resonance imaging (MRI), a dynamic frequency drift correction method for binomial water excitation method includes collecting the reference one-dimensional navigation signal by an MRI device; acquiring one current one-dimensional navigation signal after scanning N images, wherein N is a positive integer; calculating the frequency drift according to the reference one-dimensional navigation signal and the current one-dimensional navigation signal; calculating and setting the initial phase of the next radio frequency signal by the MRI device according to the frequency drift. The method provides real-time calculation of the main magnetic field frequency drift according to the one-dimensional navigation signal during the scanning period and corrects the phase of the radio frequency signal to ensure that the direction of the gradient field is always perpendicular to the plane formed by the spinning of fat protons, so there is only water signal remaining after excitation so that water images can be obtained.

3 Claims, 4 Drawing Sheets

DYNAMIC FREQUENCY DRIFT CORRECTION METHOD IN MAGNETIC RESONANCE IMAGING

BACKGROUND OF THE INVENTION

1. Field of the Invention

The present invention relates to the magnetic resonance imaging technology field, and more particularly to a dynamic frequency drift correction method for binomial water excitation method.

2. Description of the Prior Art

In magnetic resonance imaging (MRI), the body's molecular environment for hydrogen protons in fat tissue is different from that for hydrogen protons in other tissues, which results in a difference in resonance frequency of the protons; the relaxation time of the hydrogen protons in fat tissue and those in other tissues is also different when they are excited by the radio frequency pulses at the same time. When collecting signals at different echo times, the fat tissue and non-fat tissues show different phases and signal strengths.

In magnetic resonance imaging field, the methods commonly used to inhibit fat signals include fat saturation, inversion recovery, water-fat separation, etc. In the fat saturation method, the MRI device selects a radio frequency (RF) pulse at a certain frequency, and uses the RF pulse to invert the fat signals to the transverse plane, and then applies a spoiler gradient to eliminate the fat signals prior to the imaging RF pulse. In the inversion recovery method, the MRI device uses a 180° pulse to invert all signals to the negative polar axis, and applies the imaging RF pulse when the fat signal returns to zero in the longitudinal axis after the relaxation time (TI) to obtain the images with no fat signal. In the water-fat separation method such as the Dixon method, the MRI device uses multiple images with different echo times (TE) to perform water-fat separation calculation.

The fat saturation method can be used in the spin echo sequence and gradient echo sequence, but it cannot be used in a low magnetic field MRI system, because there is a little frequency offset caused by chemical shift in such a low magnetic field MRI system. The inversion recovery method can be widely used in various sequences and the signal-to-noise ratio (SNR) of the images produced by this method is low, but its scanning is time-consuming.

The binomial water excitation method is a compromise of the fat inhibition method, and can be used in various sequences for both low field MRI system and high field MRI system. Compared to the fat saturation method, the binomial water excitation method has a similar SNR but the scanning time is reduced remarkably. The main problem of the binomial water excitation method is its sensitiveness to the stability of the main (basic) magnetic field (B0), which limits the use of the binomial water excitation method in the permanent magnet MRI system.

For the binomial water excitation method, the frequency scout technology can be used to find the optimal static frequency offset to compensate inhomogeneity in the magnetic field for better inhibition of the fat. However, frequency scout cannot solve the frequency drift problem of the main magnetic field mainly caused by temperature rise in the magnet material.

Chinese patent application No. 200510068442.0, "A Method for Dynamic Detection of Resonance Frequency in Magnetic Resonance Spectroscopy Tests", a method used to perform dynamic frequency detection of magnetic resonance frequency in the magnetic resonance spectroscopy tests. The method includes: measuring the navigation signals respectively at the same time in each sequence flow of multiple sequence flows which are performed in turn, and determining the frequency drift of the magnetic resonance frequency by comparing these navigation signals, and then using the measured frequency drift to correct the individual frequency spectrums obtained from each of the sequence flows.

SUMMARY OF THE INVENTION

An object of the present invention is to provide a dynamic frequency drift correction method for binomial water excitation method, to correct the main magnetic field frequency drift caused by temperature rise in the magnet material.

This object is achieved in accordance with the present invention provides a dynamic frequency drift correction method, which includes:

acquiring the reference one-dimensional navigation signal by a magnetic resonance imaging device;

acquiring one current one-dimensional navigation signal after scanning N images, wherein N is a positive integer;

calculating the frequency drift according to said reference one-dimensional navigation signal and said current one-dimensional navigation signal;

calculating and setting the initial phase of the next radio frequency signal by the MRI device according to said frequency drift.

The calculations are executed by a computerized processor.

Preferably, the method further includes the MRI device transmitting the next radio frequency signal with said initial phase.

Preferably, the frequency drift is calculated according to $$\Delta f(n) = \frac{\text{angle}\left(\sum_{k_x} (S(n, k_x) \cdot conj(S(0, k_x)))\right)}{2\pi \cdot TE}$$

wherein $\Delta f(n)$ is the frequency drift, $S(n,k_x)$ is said current one-dimensional navigation signal, $S(0,k_x)$ is said reference one-dimensional navigation signal, angle( ) is the phase operator, conj( ) is the conjugate operator, $k_x$ is the frequency code, and TE is the echo time.

Preferably, the initial phase is calculated according to $$\theta(n)=\Delta f(n) \cdot \tau$$

wherein $\theta(n)$ is the initial phase, $\Delta f(n)$ is the frequency drift, and $\tau$ is the time interval between the first radio frequency pulse and said next radio frequency pulse in a group of radio frequency pulses.

In this technical solution, the method further includes the step of judging whether the current one-dimensional navigation signal needs to be acquired.

Preferably, the method further includes, for a group of radio frequency pulses, calculating the frequency drift according to the reference one-dimensional navigation signal and the previous one-dimensional navigation signal, and then calculating and setting the initial phase of the next radio frequency signal.

The present invention thus provides a real-time calculation of the main magnetic field frequency drift according to the one-dimensional navigation signal in the scanning period, and corrects the phase of the radio frequency signal, thereby overcoming the problem (the direction of the gradient field is not always perpendicular to the plane formed by the spinning of the fat protons) caused by the main magnetic field frequency drift. According to the technical solution of the present invention, the initial phase of the second radio frequency pulse, and the following radio frequency pulses (if any) in the multinomial water excitation method can be dynamically modified in a real-time manner to ensure that the direction of the gradient field (B1) is always perpendicular to the plane formed by the spinning of fat protons, and that there is only water signal remaining after excitation so that water images can be obtained.

DESCRIPTION OF THE PREFERRED EMBODIMENTS

First, the sequence of the binomial water excitation method will be briefly described. In each group of RF pulses of the binomial water excitation method, the amplitude values of the RF pulses are in a ratio that is the factor of binomial formulas, such as 1-1, 1-2-1, 1-3-3-1, 1-4-6-4-1, . . . .

Figure 1A:
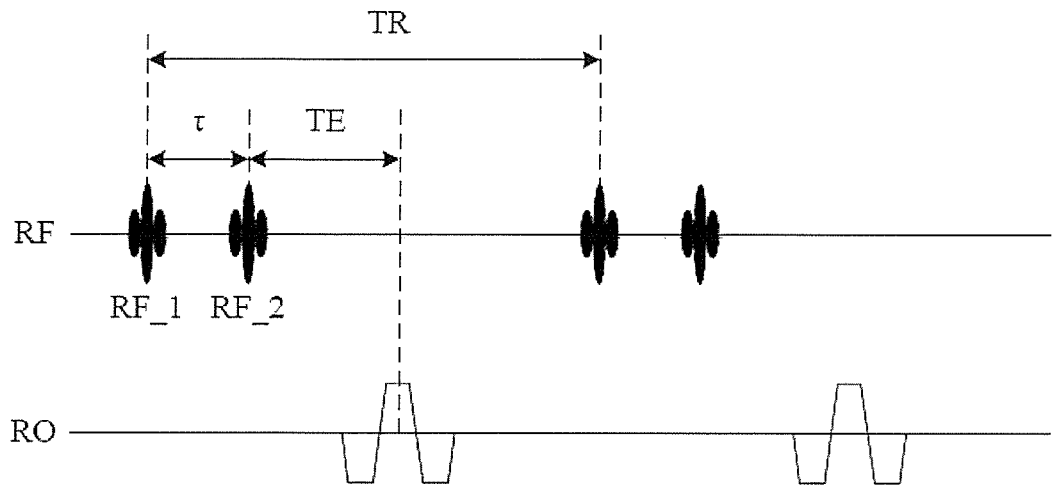
FIG. 1A and FIG. 1B are schematic diagrams of the gradient echo (GRE) sequence of binomial water excitation.
Figure 1B:
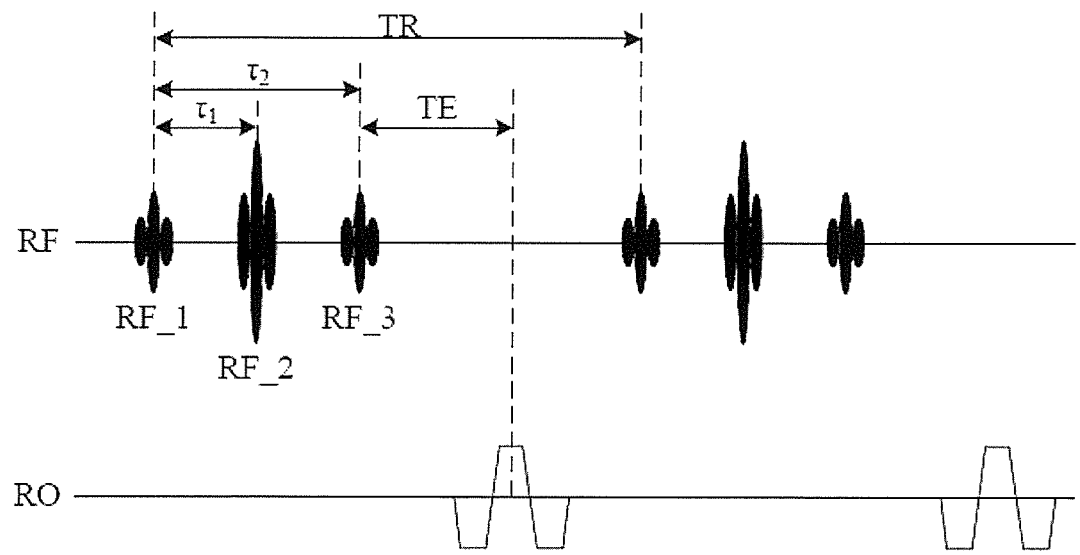

In FIGS. 1A and 1B, RF stands for radio frequency, and RO stands for readout gradient. The slice-selection gradient and the phase coding gradient are not shown in FIGS. 1A and 1B.

FIG. 1A is the schematic diagram of the GRE sequence of 1-1 binomial water excitation method. As shown in FIG. 1A, the amplitude values of the first radio frequency pulse RF_1 and the second radio frequency pulse RF_2 in each group of pulse are in the ratio of 1:1. FIG. 1B is a schematic diagram of the GRE sequence of 1-2-1 binomial water excitation method. As shown in FIG. 1B, the amplitude values of the first radio frequency pulse RF_1, the second radio frequency pulse RF_2 and the third radio frequency pulse RF_3 in each group of pulses are in the ratio of 1:2:1.

FIG. 1A and FIG. 1B also show echo time (TE) and repetition time (TR), and further show the time intervals $\tau$ $\tau_1$, $\tau_2$, etc. between the first radio frequency pulse and the radio frequency pulses following the first radio frequency pulse in each group of pulses.

The present invention provides real-time measurement of the frequency drift by using the one-dimensional (1D) navigation signal during scanning, and corrects the frequency drift for the excitation radio frequency pulse after scanning the navigation signal.

Figure 2:
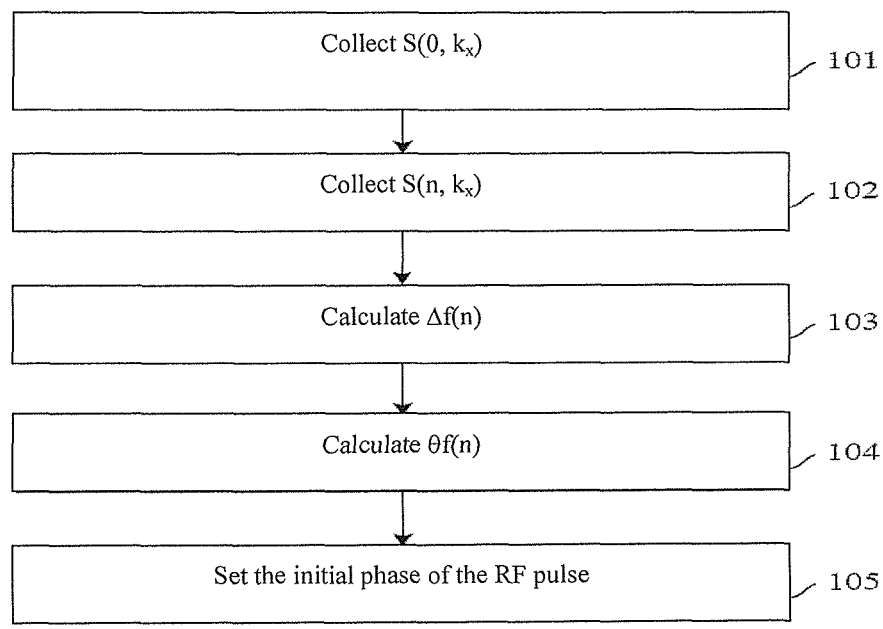
FIG. 2 is a schematic diagram showing the flow of the dynamic frequency drift correction method according to one embodiment of the present invention.

FIG. 2 is a schematic diagram showing the flow of an embodiment according to the present invention. As shown in FIG. 2, the method according to the embodiment includes the following steps:

Step 101, the MRI device acquires a reference one-dimensional navigation signal $S(0, k_x)$ at the beginning of scanning. $S(0, k_x)$ can be represented by Equation (1):

$$S(0,k_x) = \int \rho(x,y) \cdot e^{-j2\pi k_x x} dx dy \quad (1)$$

wherein $k_x$ is the frequency code (k is the space abscissa), $\rho(x,y)$ is the hydrogen proton density, and x and y are the image field coordinates.

Step 102, one current one-dimensional navigation signal $S(n,k_x)$ is acquired after scanning N images (N is a positive integer, e.g. 16, 32 etc.), that is, the $N^{th}$ one-dimensional navigation signal after the reference one-dimensional navigation signal $S(0,k_x)$ (in this embodiment, the reference one-dimensional navigation signal can be seen as the $0^{th}$ one-dimensional navigation signal in order to distinguish from the following one-dimensional navigation signals), wherein n is a positive integer. $S(n,k_x)$ can be represented by Equation (2):

$$S(n, k_x) = \int \rho(x, y) \cdot e^{-j2\pi k_x x} \cdot e^{j2\pi \int_0^{TE} \Delta f(n) dt} dx dy \quad (2)$$
$$= e^{j2\pi \int_0^{TE} \Delta f(n) dt} \cdot S(0, k_x)$$

wherein $S(n,k_x)$ is the $n^{th}$ navigation signal, TE is the echo time of the sequence (such as gradient echo (GRE) sequence), and $\Delta f(n)$ is the frequency drift when collecting the 1D navigation signal $S(n,k_x)$.

Step 103, the main magnetic field frequency drift $\Delta f(n)$, or to be exact, the main magnetic field frequency drift when the current one-dimensional navigation signal $S(n,k_x)$ is acquired, is calculated according to the reference one-dimensional navigation signal $S(0,k_x)$ and the current one-dimensional navigation signal $S(n,k_x)$.

$\Delta f(n)$ can be derived from Equation (1) and Equation (2), as shown in Equation (3):

$$\Delta f(n) = \frac{\text{angle}\left(\sum_{k_x} (S(n, k_x) \cdot conj(S(0, k_x)))\right)}{2\pi \cdot TE} \quad (3)$$

wherein angle( ) is the phase operator, used to calculate the complex argument in the brackets; conj( ) is the conjugate operator, used to calculate the conjugate of $S(0,k_x)$.

Step 104, calculating the initial phase $\theta(n)$ of the next radio frequency signal according to the frequency drift $\Delta f(n)$.

As shown in FIG. 1A, if the next pulse is the second radio frequency pulse RF_2 in a group of radio frequency pulses, the initial phase of the second radio frequency pulse RF_2 can be calculated from Equation (4), because the time interval between the first radio frequency pulse RF_1 and the second radio frequency pulse RF_2 is $\tau$:

$$\theta(n) = \Delta f(n) \cdot \tau \quad (4)$$

In the sequence of 1-2-1 binomial water excitation method shown in FIG. 1B, the initial phases of the second radio frequency pulse RF_2 and the third radio frequency pulse RF_3 can also be calculated according to the method which is similar to Equation (4), but $\tau$ in Equation (4) must be replaced by $\tau_1$, $\tau_2$ accordingly.

Step 105, the initial phase of the next radio frequency pulse is set to $\theta(n)$ obtained from the preceding calculation, to eliminate the effect caused by the frequency drift.

Then this embodiment can further include the step of the MRI device transmitting said radio frequency pulse with set initial phase (or corrected initial phase), to achieve the imaging of the binomial water excitation method. The following steps (collecting, rebuilding, etc.) are the same as the imaging process of the conventional binomial water excitation method, so they will not be repeated herein.

Figure 3:
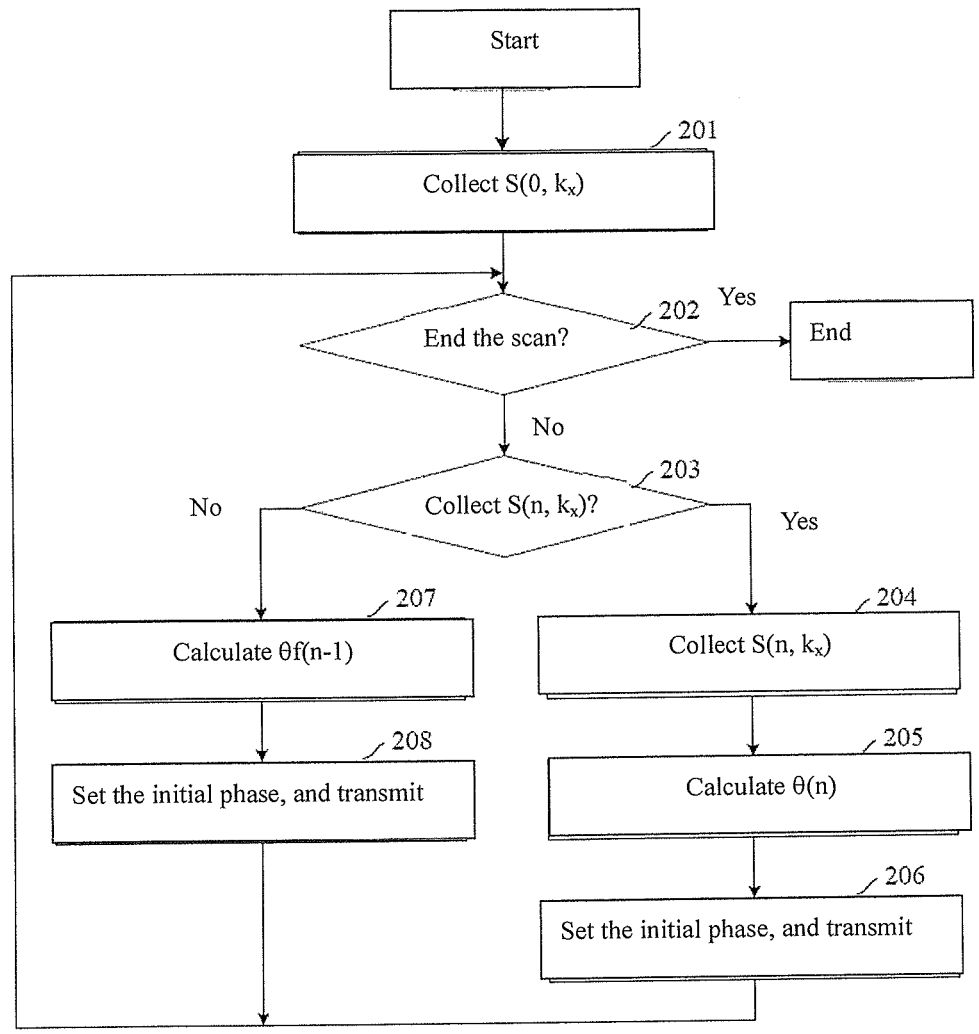
FIG. 3 is a schematic diagram showing the flow of the dynamic frequency drift correction method according to another embodiment of the present invention.

FIG. 3 is a schematic diagram showing the flow of another embodiment according to the present invention. This embodiment takes multiple groups of radio frequency pulses into account during the entire scanning process. As shown in FIG. 3, the method according to the embodiment includes the following steps:

Step 201: the MRI device collects a reference one-dimensional navigation signal $S(0, k_x)$ at the beginning of scanning. $S(0, k_x)$ can be represented by Equation (1) above:

Step 202: it is judged whether the scanning should be ended; if yes, the flow of the embodiment is ended, and if no, Step 203 and its following steps are performed.

Step 203: it is judged whether one current one-dimensional navigation signal needs to be collected; if yes, Step 204 and its following steps are performed, and if no, Step 207 and its following steps are performed.

The following steps assume that N images have been scanned, wherein N is positive integer.

Step 204: one current one-dimensional navigation signal $S(n,k_x)$, or the $n^{th}$ one-dimensional navigation signal after the reference one-dimensional navigation signal $S(0,k_x)$, is collected, wherein n is a positive integer. $S(n,k_x)$ can be represented by Equation (2) above:

Step 205: the main magnetic field frequency drift $\Delta f(n)$, or more precisely, the main magnetic field frequency drift when said current one-dimensional navigation signal $S(n,k_x)$ is collected, is calculated according to the reference one-dimensional navigation signal $S(0,k_x)$ and the current one-dimensional navigation signal $S(n,k_x)$ by using the Formula (3) above.

Then the initial phase $\theta(n)$ of the next radio frequency signal is calculated according to the frequency drift $\Delta f(n)$ by using the Equation (4) above.

Step 206: the initial phase of the next radio frequency pulse is set to $\theta(n)$ obtained from the preceding calculation, and the radio frequency pulse whose initial phase has been set is transmitted. Then the judgment in Step 202 and its subsequent steps are performed.

Step 207: because the current one-dimensional navigation signal $S(n,k_x)$ is not collected, the main magnetic field frequency drift $\Delta f(n-1)$, or to be exact, the main magnetic field frequency drift when collecting the previous one-dimensional navigation signal $S(n-1,k_x)$, can be calculated according to the reference one-dimensional navigation signal $S(0, k_x)$ and the previous one-dimensional navigation signal $S(n-1,k_x)$ by using the Equation (3) above.

Then, the initial phase $\theta(n-1)$ of the next radio frequency signal is calculated according to the frequency drift $\Delta f(n-1)$ by using the Equation (4) above.

Step 208: the initial phase of the next radio frequency pulse is set to $\theta(n-1)$ obtained from the preceding calculation, and the radio frequency pulse whose initial phase has been set is transmitted. Then the judgment in Step 202 and the related subsequent steps are performed.

In Step 207 and Step 208, for a group of radio frequency pulses, the MRI device calculates the frequency drift by using the reference one-dimensional navigation signal and the previous one-dimensional navigation signal, and calculates and sets the initial phase of the next radio frequency signal according to this frequency drift, and then transmits said radio frequency pulse. Therefore, it is not necessary for the MRI device to collect the current one-dimensional navigation signal for each group of radio frequency pulses, making it easier to implement the present invention.

In the embodiments of the present invention above, the one-dimensional navigation signal is collected during scanning so that the main magnetic field frequency drift can be dynamically measured in a real-time manner. According to the technical solution of the present invention, the initial phases of the subsequent radio frequency pulses such as the second radio frequency pulse can be dynamically corrected in a real-time manner to ensure that the direction of the gradient field (B1) is always perpendicular to the plane formed by the spinning of fat protons, and that there is only water signal remaining after excitation.

Figure 4A:
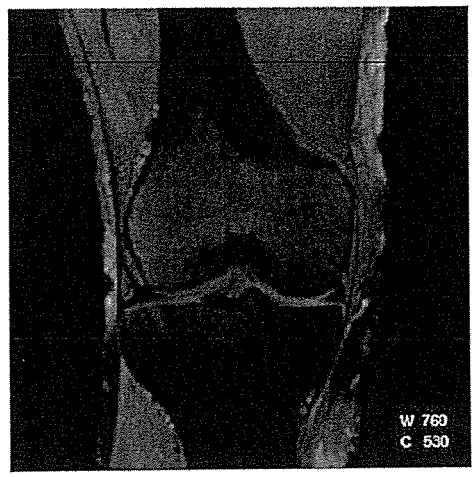
FIG. 4A is an image obtained according to the conventional method.
Figure 4B:
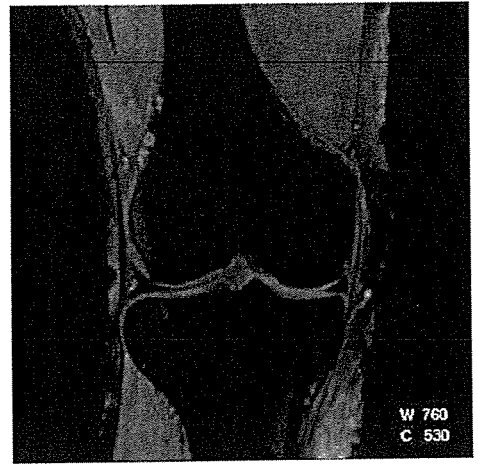
FIG. 4B is an image obtained according to the present invention.

FIG. 4A and FIG. 4B are both GRE 3D fat inhibition images for the same position, wherein FIG. 4A shows the conventional binomial water excitation method, and FIG. 4B shows the dynamic frequency drift correction method provided by the present invention. By comparing FIGS. 4A and 4B, it can be seen that the bone marrow (i.e. fat) signal in FIG. 4B is much lower than the bone marrow signal in FIG. 4A, while the muscle (i.e. water) signal is much higher than the muscle signal in FIG. 4B; therefore, the image obtained according to the correction method of the present invention has much higher contrast.

Although modifications and changes may be suggested by those skilled in the art, it is the intention of the inventor to embody within the patent warranted hereon all changes and modifications as reasonably and properly come within the scope of his contribution to the art.

We claim as our invention:

1. A dynamic frequency drift correction method in magnetic resonance imaging, comprising the steps of:
   operating a magnetic resonance data acquisition device with a gradient echo imaging pulse sequence, that comprises a plurality of RF pulses, to acquire magnetic resonance image data in a basic magnetic field that causes a frequency drift;
   operating said data acquisition device to acquire a reference one-dimensional navigation signal;
   operating said magnetic resonance data acquisition device to repeat said gradient echo imaging pulse sequence N times to acquire N images with said pulse sequence, wherein N is a positive integer, and only after repeating said pulse sequence N times acquiring a current one-dimensional navigation signal;
   in a computerized processor, calculating said frequency drift from said reference one-dimensional navigation signal and said current one-dimensional navigation signal;
   in said computerized processor, calculating an initial phase of a next of said radio frequency pulses in a next repetition of said gradient echo imaging pulse sequence, that follows said N repetitions, according to said frequency drift; and
   setting said initial phase of said next of said radio frequency pulses in said next repetition of said gradient echo imaging pulse sequence to acquire further magnetic resonance data with said data acquisition unit.

2. A method as claimed in claim 1, comprising calculating the frequency drift according to $$\Delta f(n) = \frac{\text{angle}\left(\sum_{k_x} (S(n, k_x) \cdot conj(S(0, k_s)))\right)}{2\pi \cdot TE}$$

wherein, $\Delta f(n)$ is the frequency drift, $S(n,k_x)$ is said current one-dimensional navigation signal, $S(0,k_x)$ is said reference one-dimensional navigation signal, angle( ) is the phase operator, conj( ) is the conjugate operator, $k_x$ is the frequency code, and TE is the echo time.

3. A method as claimed in claim 2, comprising calculating the initial phase according to $$\theta(n) = \Delta f(n) \cdot \tau$$

wherein, $\theta(n)$ is the initial phase, $\Delta f(n)$ is the frequency drift, and $\tau$ is the time interval between the first radio frequency pulse and said next radio frequency pulse in a group of radio frequency pulses.

* * * * *